(12) United States Patent
Abatake

(10) Patent No.: US 10,050,599 B2
(45) Date of Patent: Aug. 14, 2018

(54) BAW DEVICE AND METHOD OF MANUFACTURING BAW DEVICE

(71) Applicant: DISCO CORPORATION, Tokyo (JP)

(72) Inventor: Jun Abatake, Tokyo (JP)

(73) Assignee: DISCO CORPORATION, Tokyo (JP)

(*) Notice: Subject to any disclaimer, the term of this patent is extended or adjusted under 35 U.S.C. 154(b) by 2 days.

(21) Appl. No.: 15/238,323

(22) Filed: Aug. 16, 2016

(65) Prior Publication Data

US 2017/0063334 A1    Mar. 2, 2017

(30) Foreign Application Priority Data

Aug. 27, 2015 (JP) .................................. 2015-168073

(51) Int. Cl.
| | |
|---|---|
| *H03H 9/09* | (2006.01) |
| *H03H 9/05* | (2006.01) |
| *H03H 9/54* | (2006.01) |
| *H03H 3/02* | (2006.01) |
| *H03H 9/02* | (2006.01) |

(52) U.S. Cl.
CPC .......... *H03H 9/02047* (2013.01); *H03H 3/02* (2013.01); *H03H 9/0211* (2013.01); *H03H 9/0504* (2013.01); *H03H 9/09* (2013.01); *H03H 9/54* (2013.01)

(58) Field of Classification Search
CPC .............. H03H 3/02; H03H 2003/021; H03H 2003/023; H03H 2003/025; H03H 9/02047; H03H 9/02055; H03H 9/0211; H03H 9/0504; H03H 9/09; H03H 9/172; H03H 9/173; H03H 9/174; H03H 9/175; H03H 9/54; H03H 9/586; H03H 9/587; H03H 9/588; H03H 9/589

USPC ......... 333/133, 187–192; 310/312, 322, 326, 310/327, 335, 348

See application file for complete search history.

(56) References Cited

U.S. PATENT DOCUMENTS

| | | | | |
|---|---|---|---|---|
| 6,943,647 | B2* | 9/2005 | Aigner ..................... | H03H 3/02 29/25.35 |
| 7,230,511 | B2* | 6/2007 | Onishi ..................... | H03H 3/02 333/187 |
| 7,889,025 | B1* | 2/2011 | Kosinski .............. | H03H 9/0211 310/313 B |
| 2015/0318461 | A1* | 11/2015 | Jacobsen ................ | H03H 9/175 331/155 |
| 2017/0033768 | A1* | 2/2017 | Aigner ..................... | H03H 3/04 |

FOREIGN PATENT DOCUMENTS

| | | | |
|---|---|---|---|
| JP | 60-068710 | * | 4/1985 |
| JP | 2003-008396 | | 1/2003 |
| JP | 2008-236556 | * | 10/2008 |

OTHER PUBLICATIONS

English language machine translation of JP 2008-236556, published Oct. 2, 2008, 6 pages.*

* cited by examiner

*Primary Examiner* — Barbara Summons
(74) *Attorney, Agent, or Firm* — Greer Burns & Crain Ltd.

(57) ABSTRACT

A BAW device includes a substrate and a piezoelectric element formed on a surface of the substrate. The substrate has a plurality of elastic wave diffusing regions disposed therein for diffusing an elastic wave, the elastic wave diffusing regions being formed by modifying the inside of the substrate with a laser beam.

2 Claims, 5 Drawing Sheets

BAW DEVICE AND METHOD OF MANUFACTURING BAW DEVICE

BACKGROUND OF THE INVENTION

Field of the Invention

The present invention relates to a bulk acoustic wave (BAW) device which uses a bulk acoustic wave that is propagated through a substance, and a method of manufacturing such a BAW device.

Description of the Related Art

Bandpass filters for passing only electric signals in desired frequency bands play an important role in radio communication devices including mobile phones. As one of the bandpass filters, there has been known a surface acoustic wave (SAW) device (SAW filter) which uses surface acoustic waves. The SAW device includes, for example, a crystal substrate made of a piezoelectric material such as crystal ($SiO_2$) and interdigital electrodes (IDT: interdigital transducer) formed on the face side of the crystal substrate. The SAW device passes only an electric signal in a frequency band determined depending on the type of the piezoelectric material, the gap between the electrodes, etc.

The SAW device may find itself in a situation where part of an elastic wave generated in the vicinity of an input electrode is propagated through the crystal substrate and reflected by the reverse side of the crystal substrate. When the reflected elastic wave reaches an output electrode, the frequency characteristics of the SAW device are deteriorated. One solution has been to form an uneven microstructure on the reverse side of the crystal substrate for making it easy to scatter the elastic wave, thereby preventing the reflected elastic wave from reaching the output electrode (see, for example, Japanese Patent Laid-Open No. 2003-8396).

SUMMARY OF THE INVENTION

In recent years, attention has been attracted to a BAW device (BAW filter) which uses a bulk acoustic wave that is propagated through a substance. The BAW device has a resonator (piezoelectric element) including a piezoelectric film made of a piezoelectric material such as aluminum nitride (AlN) or the like and sandwiched by electrodes of molybdenum (Mo) or the like. The resonator is formed on a substrate made of a semiconductor material such as silicon (Si) or the like, for example. Since the BAW device is free of the interdigital electrodes of the SAW device, it is conducive to lower loss and higher electric power resistance. Furthermore, as it is not necessary to use a crystal substrate made of a piezoelectric material, the BAW device can be formed integrally with other active devices.

For manufacturing a BAW device, the reverse side of a substrate with a plurality of resonators formed on the face side thereof is ground to thin the substrate to a predetermined thickness, and then the substrate is diced into a plurality of BAW devices corresponding to the respective resonators. Since even the BAW device thus manufactured is liable to have its frequency characteristics deteriorated by the elastic wave reflected by the reverse side of the substrate, a rough grinding process is performed on the substrate to form an uneven microstructure on the reverse side of the substrate, and produced mechanical distortions are removed by etching. However, the etching process employed to remove the mechanical distortions produced by the grinding process is problematic in that it increases environmental burdens.

Accordingly, an object of the present invention is to provide a BAW device which can reduce environmental burdens posed when being manufactured and a method of manufacturing a BAW device.

In accordance with a first aspect of the present invention, there is provided a BAW device including a substrate and a piezoelectric element formed on a surface of the substrate, wherein the substrate has a plurality of elastic wave diffusing regions disposed therein for diffusing an elastic wave, the elastic wave diffusing regions being formed by modifying the substrate with a laser beam.

According to a second aspect of the present invention, there is also provided a method of manufacturing a BAW device, including irradiating a substrate with a piezoelectric element formed on a face side thereof with a laser beam having a wavelength that is transmittable to the substrate, from a reverse side of the substrate while the laser beam is being focused at a point within the substrate, thereby modifying the inside of the substrate at predetermined intervals to form a plurality of elastic wave diffusing regions in the substrate for diffusing an elastic wave.

Since the BAW device according to the present invention includes the elastic wave diffusing regions formed within the substrate by modifying the substrate with a laser beam, for diffusing an elastic wave propagated from the piezoelectric element, it is not necessary to roughly grind the reverse side of the substrate to form an uneven microstructure thereon for diffusing an elastic wave, unlike the existing BAW devices. Therefore, there is no need to etch the substrate for removing mechanical distortions caused by grinding, so that environmental burdens posed when the BAW device is manufactured are reduced.

The above and other objects, features and advantages of the present invention and the manner of realizing them will become more apparent, and the invention itself will best be understood from a study of the following description and appended claims with reference to the attaching drawings showing a preferred embodiment of the invention.

DETAILED DESCRIPTION OF THE PREFERRED EMBODIMENT

An embodiment of the present invention will be described below with reference to the accompanying drawings. FIG.

Figure 1A:
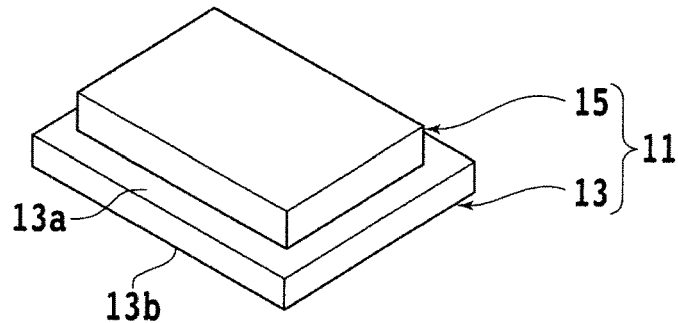
FIG. 1A is a perspective view schematically illustrating an upper surface of a BAW device.
Figure 1B:
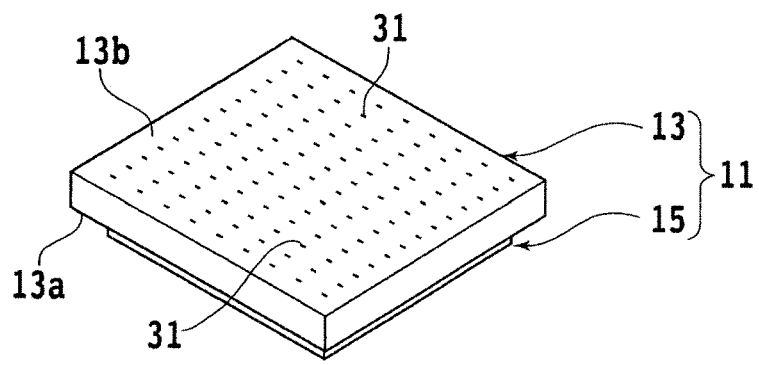
FIG. 1B is a perspective view schematically illustrating a lower surface of the BAW device.
Figure 1C:
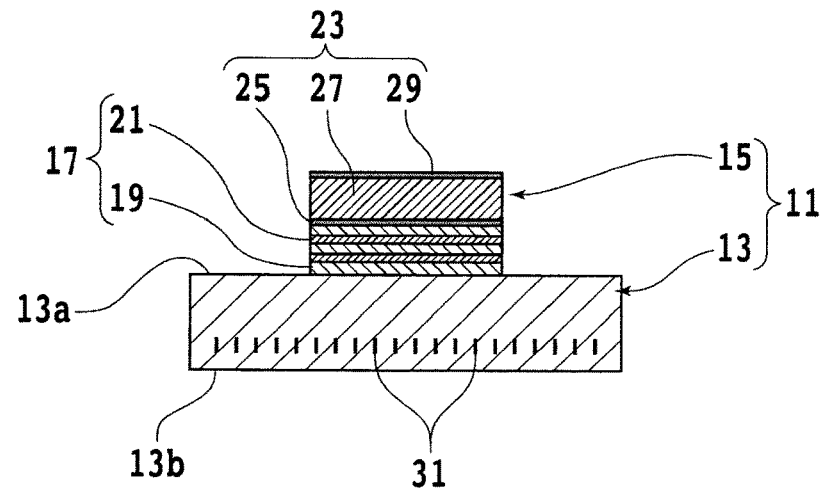
FIG. 1C is a cross-sectional view schematically illustrating a layered structure of the BAW device.

1A is a perspective view schematically illustrating an upper surface of a BAW device, FIG. 1B is a perspective view schematically illustrating a lower surface of the BAW device, and FIG. 1C is a cross-sectional view schematically illustrating a layered structure of the BAW device. As illustrated in FIGS. 1A, 1B, and 1C, a BAW device (BAW device chip) 11 according to the embodiment of the present invention has a rectangular substrate 13 made of a semiconductor material such as silicon (Si) or the like. A resonance unit 15 wherein films having various functions are layered is disposed on a first surface (face side) 13a of the substrate 13.

The resonance unit 15 includes an acoustic multilayer film 17 in a lower portion thereof (near the substrate 13). The acoustic multilayer film 17 includes first films 19 made of a material such as silicon oxide ($SiO_2$) or the like which is of a low acoustic impedance and second films 21 made of a material such as tungsten (W) or the like which is of a high acoustic impedance, the first and second films 19 and 21 being superposed alternately with each other. A resonator (piezoelectric element) 23 is disposed on the acoustic multilayer film (remotely from the substrate 13). The resonator 23 includes a lower electrode 25 made of an electroconductive material such as molybdenum (Mo) or the like, a piezoelectric film 27 formed on an upper surface of the lower electrode 25 and made of a piezoelectric material such as aluminum nitride (AlN) or the like, and an upper electrode 29 formed on an upper surface of the piezoelectric film 27 and made of an electroconductive material such as molybdenum or the like. The resonator 23 causes a bulk elastic wave produced by the piezoelectric film 27 to resonate at a central frequency that is determined by the materials, thicknesses, etc. of the lower electrode 25, the piezoelectric film 27, and the upper electrode 29. Each of the first and second films 19 and 21 of the acoustic multilayer film 17 is of a thickness which is equal to a ¼ of the wavelength in each film of the bulk elastic wave that has resonated at the above central frequency. The first and second films 19 and 21 reflect the bulk elastic wave that has resonated in the resonator 23 under conditions to intensify the bulk elastic wave with each other. This prevents the bulk elastic wave produced by the resonator 23 from being propagated to the substrate 13.

However, the BAW device 11 thus constructed may allow the bulk elastic wave produced by the piezoelectric film 27 to leak slightly into the substrate 13. If the leaking bulk elastic wave is reflected by a second surface (reverse side) 13b of the substrate 13 back into the resonator 23, then the frequency characteristics of the BAW device 11 are deteriorated.

According to the present embodiment, the BAW device 11 includes a plurality of elastic wave diffusing regions 31 disposed within the substrate 13 for diffusing (scattering) the bulk elastic wave. The elastic wave diffusing regions 31 are regions generated by modifying the inside of the substrate 13 with a laser beam to change the characteristics thereof for propagating the bulk elastic wave. Conditions such as the size, pitch, etc. of the elastic wave diffusing regions 31 can be adjusted as desired in a range for diffusing the bulk elastic wave appropriately. According to the present embodiment, the elastic wave diffusing regions 31 are formed in a size (width, diameter) ranging from 7 μm to 8 μm each at a pitch of 11 μm×15 μm. The elastic wave diffusing regions 31 formed within the substrate 13 may diffuse the bulk elastic wave propagated through the substrate 13 so as to suppress the entry into the resonator 23.

According to the present embodiment, therefore, it is not necessary to roughly grind the reverse side 13b of the substrate 13 to form an uneven microstructure thereon for diffusing the bulk elastic wave. In other words, there is no need to etch the substrate 13 for removing mechanical distortions caused by grinding, so that environmental burdens posed when the BAW device is manufactured are reduced.

The elastic wave diffusing regions 31 serve not only to diffuse the bulk elastic wave that has leaked from the piezoelectric film 27, but also to diffuse noise components such as bulk elastic waves produced by other factors. Consequently, the BAW device 11 according to the present embodiment offers excellent frequency characteristics compared with other BAW devices.

Figure 2A:
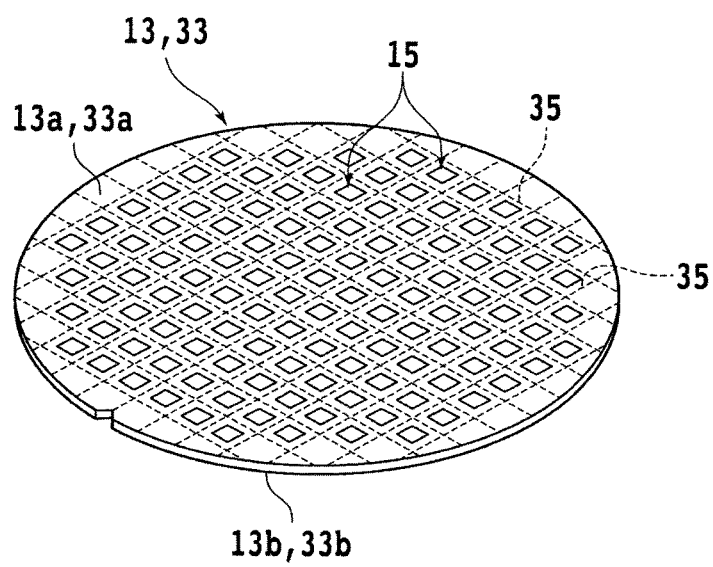
FIG. 2A is a perspective view schematically illustrating by way of example a substrate with a plurality of resonance units formed thereon.
Figure 2B:
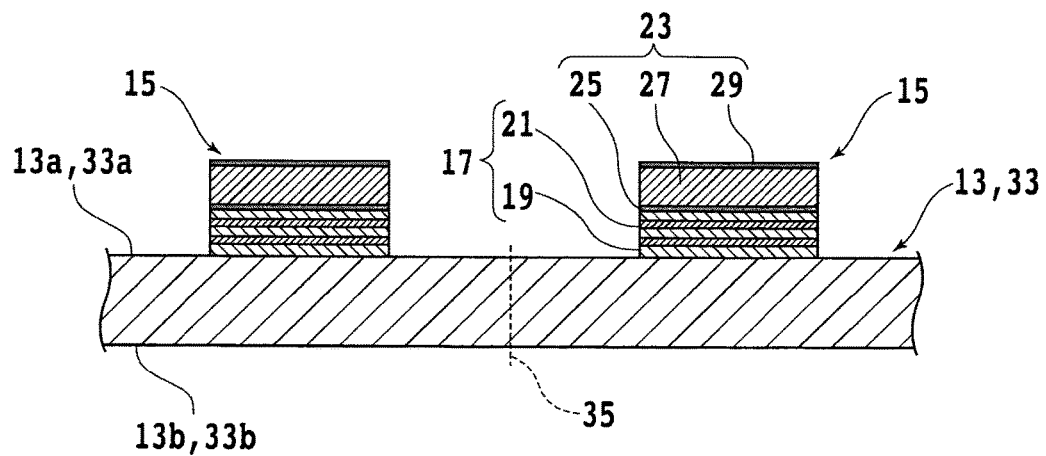
FIG. 2B is a fragmentary cross-sectional view schematically illustrating by way of example the substrate with the resonance units formed thereon.

A method of manufacturing the BAW device 11 will be described below. First, a substrate with a plurality of resonance units 15 formed thereon is prepared. FIG. 2A is a perspective view schematically illustrating by way of example a substrate 33 with a plurality of resonance units 15 formed thereon, and FIG. 2B is a fragmentary cross-sectional view schematically illustrating by way of example the substrate 33 with the resonance units 15 formed thereon. The substrate 33 is a circular wafer made of a semiconductor material such as silicon or the like, for example. The substrate 33 has a first surface (face side) 33a demarcated into a plurality of areas by projected dicing lines (streets) 35 arranged in a grid-like pattern, and the resonance units 15 are disposed in the demarcated areas. When the substrate 33 is divided along the projected dicing lines 35, BAW devices 11 including rectangular substrates 13 are manufactured. Conditions such as the material, thickness, etc. of the substrate 33 can be varied in a range suitable for the formation of the elastic wave diffusing regions 31. For example, the substrate 33 may be made of ceramics such as alumina ($Al_2O_3$) or the like.

Figure 3:
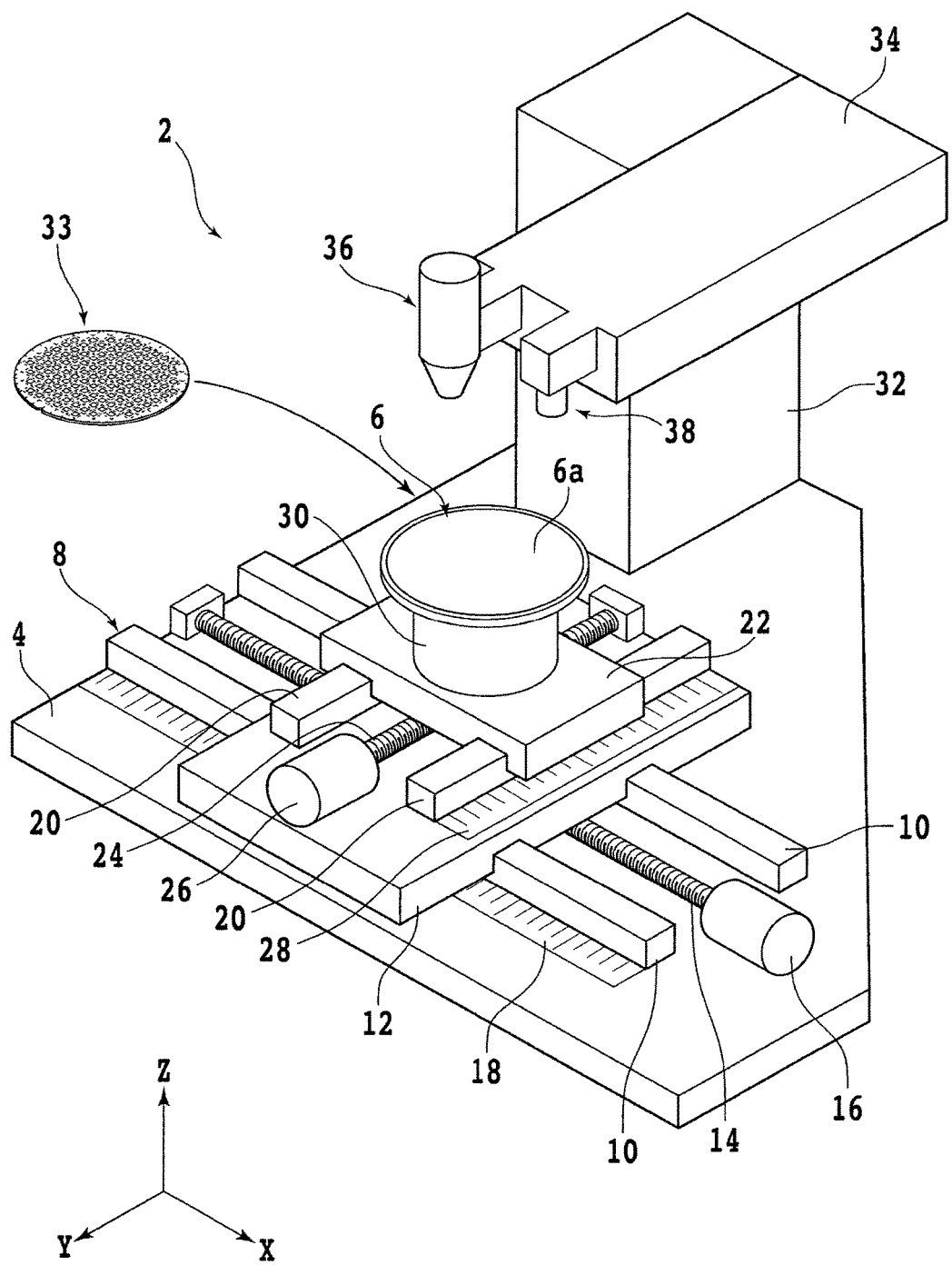
FIG. 3 is a perspective view schematically illustrating by way of example a laser processing apparatus.
Figure 4A:
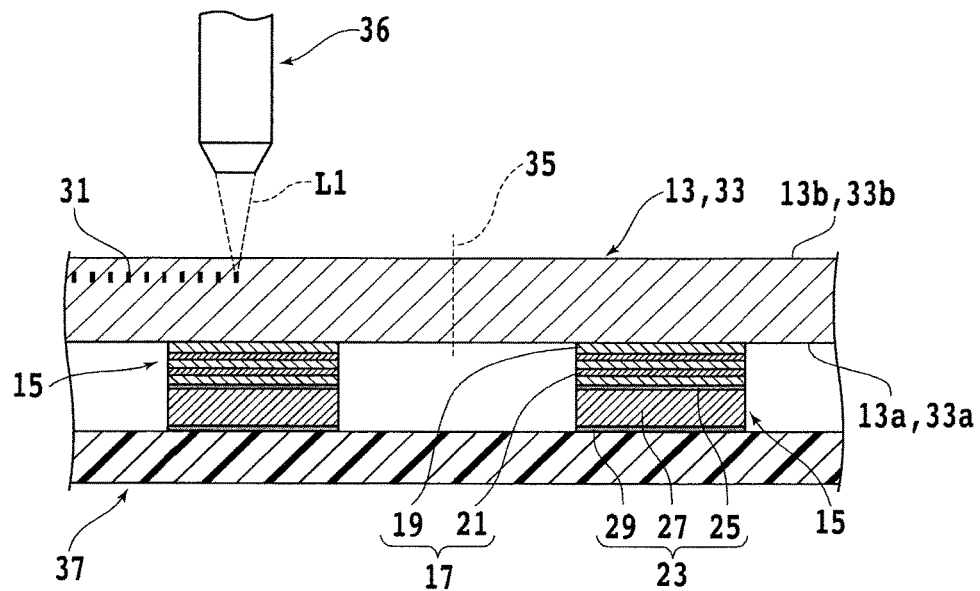
FIG. 4A is a fragmentary side elevational view, partly in section, schematically illustrating an elastic wave diffusing region forming step.

After the substrate 33 has been prepared, an elastic wave diffusing region forming step is carried out to form elastic wave diffusion regions 31 within the substrate 33. FIG. 3 is a perspective view schematically illustrating by way of example a laser processing apparatus 2 used in the elastic wave diffusing region forming step, etc., and FIG. 4A is a fragmentary side elevational view, partly in section, schematically illustrating the elastic wave diffusing region forming step. As illustrated in FIG. 3, the laser processing apparatus 2 has a base 4 on which various structures thereof are mounted. The base 4 supports on its upper surface a horizontally moving mechanism 8 for horizontally moving a chuck table 6 for attracting and holding the substrate 33 in X-axis directions (processing feed directions) and Y-axis directions (indexing feed directions). The horizontally moving mechanism 8 includes a pair of X-axis guide rails 10 fixed to the upper surface of the base 4 and extending parallel to the X-axis directions.

An X-axis movable table 12 is mounted slidably on the X-axis guide rails 10. A nut (not illustrated) is attached to the reverse side (lower surface) of the X-axis movable table 12, and is threaded over an X-axis ball screw 14 extending parallel to the X-axis guide rails 10. An X-axis pulse motor 16 is coupled to an end of the X-axis ball screw 14. When the X-axis ball screw 14 is rotated about its own axis by the X-axis pulse motor 16, the X-axis movable table 12 moves in one of the X-axis directions along the X-axis guide rails 10. An X-axis scale 18 for detecting the position of the X-axis movable table 12 along the X-axis directions is disposed in a position adjacent to one of the X-axis guide rails 10.

The X-axis movable table 12 supports on its face side (upper surface) a pair of Y-axis guide rails 20 fixed thereto and extending parallel to the Y-axis directions. A Y-axis movable table 22 is mounted slidably on the Y-axis guide rails 20. A nut (not illustrated) is attached to the reverse side (lower surface) of the Y-axis movable table 22, and is threaded over a Y-axis ball screw 24 extending parallel to the Y-axis guide rails 20. A Y-axis pulse motor 26 is coupled to an end of the Y-axis ball screw 24. When the Y-axis ball screw 24 is rotated about its own axis by the Y-axis pulse motor 26, the Y-axis movable table 22 moves in one of the Y-axis directions along the Y-axis guide rails 20. A Y-axis scale 28 for detecting the position of the Y-axis movable table 22 along the Y-axis directions is disposed in a position adjacent to one of the Y-axis guide rails 20.

A support table 30 is mounted on the face side (upper surface) of the Y-axis movable table 22, and the chuck table 6 is disposed on the upper end of the support table 30. The chuck table 6 has a face side (upper surface) serving as a holding surface 6a for attracting and holding the first surface 33a side of the substrate 33. The holding surface 6a is connected to a suction source (not illustrated) through a suction channel (not illustrated) defined within the chuck table 6. A rotary actuator (not illustrated) is disposed beneath the chuck table 6 for rotating the chuck table 6 about a rotational axis extending parallel to Z-axis directions.

The laser processing apparatus 2 also includes a columnar support structure 32 disposed behind the horizontally moving mechanism 8. The support structure 32 supports on its upper portion a support arm 34 which extends in the Y-axis directions. The support arm 34 supports on its tip end a laser processing unit 36 for irradiating the substrate 33 on the chuck table 6 with a pulse-oscillated laser beam, and a camera 38 disposed in a position adjacent to the laser processing unit 36 for capturing an image of the first surface 33a of the substrate 33. The image captured of the substrate 33 or the like by the camera 38 is used for positional adjustment of the substrate 33 and the laser processing unit 36, for example.

Components including the chuck table 6, the horizontally moving mechanism 8, the laser processing unit 36, the camera 38, etc. are connected to a control unit (not illustrated). The control unit controls operation of the components to process the substrate 33 appropriately.

In the elastic wave diffusing region forming step, as illustrated in FIG. 4A, a protective tape 37 is applied to the first surface 33a side (the resonance units 15 side) of the substrate 33. Then, the substrate 33 is placed on the chuck table 6 so that the protective tape 37 and the holding surface 6a face each other, and the vacuum pressure from the suction source is applied to the holding surface 6a. The substrate 33 is now attracted and held on the chuck table 6 with a second surface (reverse side) 33b being exposed upwardly. Then, the chuck table 6 is moved and rotated to bring the laser processing unit 36 into alignment with a position where elastic wave diffusing regions 31 start to be formed in the substrate 33. As illustrated in FIG. 4A, while the laser processing unit 36 is emitting a laser beam L1 having a wavelength that is difficult to be absorbed by the substrate 33, i.e., a wavelength that is transmittable to the substrate 33, toward the substrate 33, the chuck table 6 is moved horizontally. The laser beam L1 is focused at a point within the substrate 33. When the laser beam L1 whose wavelength is difficult to be absorbed by the substrate 33 is applied from the second surface 33b of the substrate 33 and focused within the substrate 33, the inside of the substrate 33 is modified to form the elastic wave diffusing regions 31 at intervals in the substrate 33.

For example, conditions for forming the elastic wave diffusing regions 31, each having a size (width, diameter) ranging from 7 μm to 8 μm, at a pitch of 11 μm×15 μm in a substrate 33 which is made of silicon are set as follows.
Wavelength: 1064 nm ($YVO_4$ pulse laser)
Repetitive frequency: 50 kHz to 120 kHz
Output: 0.1 W to 0.3 W When the elastic wave diffusing regions 31 have been formed under the conditions set as above within the substrate 33 except in the vicinity of the projected dicing lines 35, the elastic wave diffusing region forming step is finished. The conditions for forming elastic wave diffusing regions 31 are not limited to the above details, but may be varied depending on the size, pitch, etc. of elastic wave diffusing regions 31 to be formed.

Figure 4B:
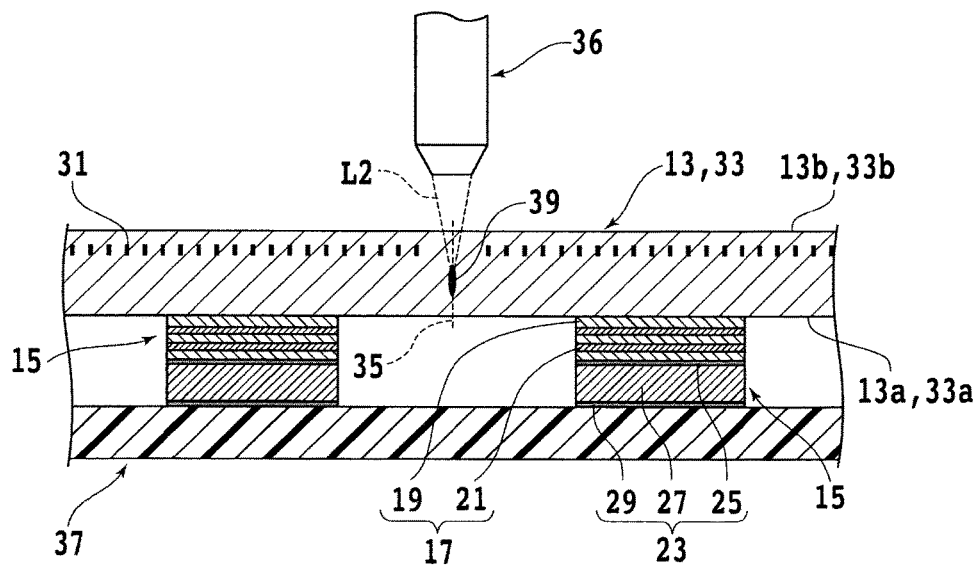
FIG. 4B is a fragmentary cross-sectional view schematically illustrating a modified layer forming step.

The elastic wave diffusing region forming step is followed by a modified layer forming step for forming a modified layer that serves as a point at which to start dicing the substrate 33 along the projected dicing lines 35. FIG. 4B is a fragmentary cross-sectional view schematically illustrating the modified layer forming step. The modified layer forming step is continuously carried out by the laser processing apparatus 2. Specifically, the chuck table 6 is moved and rotated to bring the laser processing unit 36 into alignment with an end of a projected dicing line 35 to be processed. As illustrated in FIG. 4B, while the laser processing unit 36 is emitting a laser beam L2 having a wavelength that is difficult to be absorbed by the substrate 33 toward the substrate 33, the chuck table 6 is moved in a direction parallel to the projected dicing line 35 to be processed. Specifically, the laser beam L2 is applied from the reverse side 33b of the substrate 33 along the projected dicing line 35. At this time, the laser beam L2 is focused at a point within the substrate 33. The inside of the substrate 33 is now modified along the projected dicing line 35 to be processed, forming a modified layer 39.

Conditions for forming the modified layer 39 in the substrate 33 which is made of silicon are set as follows.
Wavelength: 1064 nm ($YVO_4$ pulse laser)
Repetitive frequency: 100 kHz
Output: 1 W to 1.5 W
Moving speed (processing feed speed): 100 mm/s Conditions such as power density, etc. of the laser beam L2 are adjusted in a range for forming an appropriate modified layer 39 in the substrate 33. The above process is repeated to form modified layers 39 along all the projected dicing lines 35, whereupon the modified layer forming step is finished.

Figure 5A:
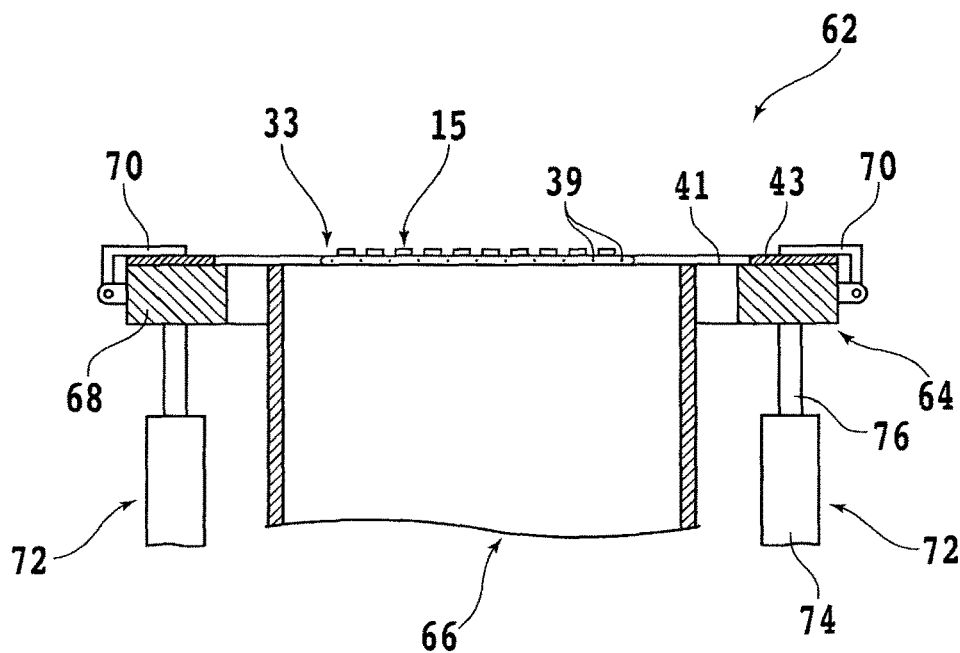
FIGS. 5A and 5B are fragmentary cross-sectional views schematically illustrating a dividing step.
Figure 5B:
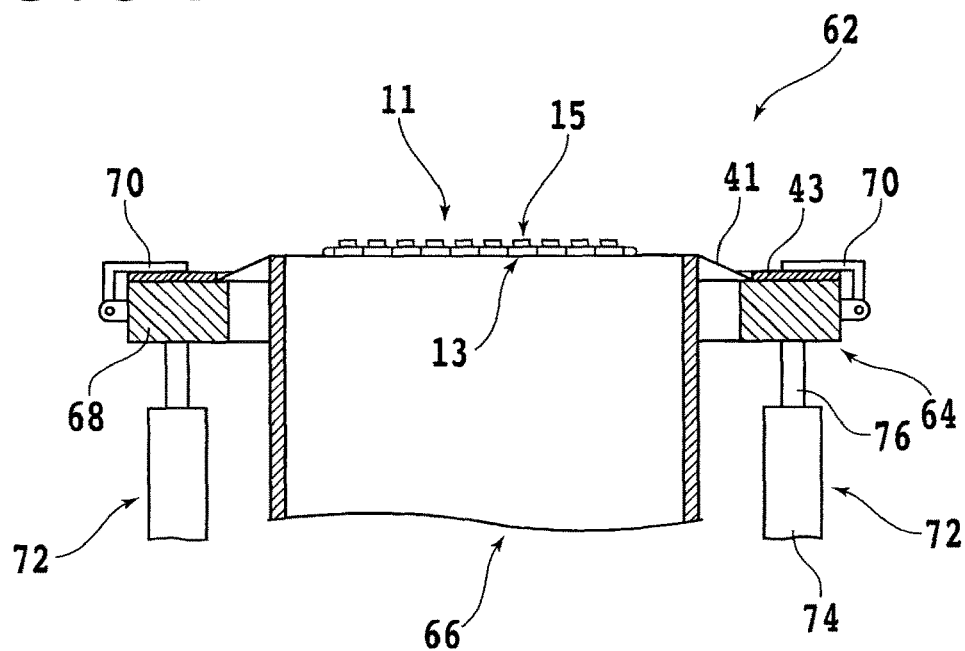

The modified layer forming step is followed by a dividing step for exerting external forces to the substrate 33 to divide the substrate 33 along the projected dicing lines 35 into a plurality of substrates 13 (BAW devices 11). FIGS. 5A and 5B are fragmentary cross-sectional views schematically illustrating the dividing step. The dividing step is carried out by an expanding apparatus 62. In the dividing step, an expandable tape 41 is applied to the second surface 33b side of the substrate 33, and an annular frame 43 is fixed to an outer peripheral portion of the expandable tape 41. At the same time, the protective tape 37 applied to the first surface 33a side of the substrate 33 is peeled off.

As illustrated in FIGS. 5A and 5B, the expanding apparatus 62 has a support structure 64 for supporting the substrate 33 and a hollow cylindrical expanding drum 66 for expanding the expandable tape 41 applied to the substrate 33. The expanding drum 66 has an inside diameter greater than the diameter of the substrate 33 and an outside diameter smaller than the inside diameter of the frame 43. The support structure 64 includes a frame support table 68 for supporting the frame 43. The frame support table 68 has an upper surface serving as a support surface for supporting the frame 43. A plurality of clamps 70 for securing the frame 43 to the support surface of the frame support table 68 are mounted on an outer peripheral portion of the frame support table 68. A lifting and lowering mechanism 72 is disposed below the support structure 64. The lifting and lowering mechanism 72 has a plurality of cylinder cases 74 fixedly mounted on a base (not illustrated) disposed therebeneath and a plurality of piston rods 76 inserted respectively in the cylinder cases 74. The frame support table 68 is fixed to the upper ends of the piston rods 76. The lifting and lowering mechanism 72 lifts and lowers the support structure 64 to move the upper surface, i.e., the support surface, of the frame support table 68 between a reference position (see FIG. 5A) at the same height as the upper end of the expanding drum 66 and an expanding position (see FIG. 5B) lower than the upper end of the expanding drum 66.

In the dividing step, as illustrated in FIG. 5A, the frame 43 is placed on the upper surface of the frame support table 68 that has been brought to the reference position, and is secured to the upper surface of the frame support table 68 by the clamps 70. The upper end of the expanding drum 66 is now held in contact with the expandable tape 41 positioned between the substrate 33 and the frame 43. Then, the lifting and lowering mechanism 72 lowers the support structure 64 to move the upper surface of the frame support table 68 into the expanding position lower than the upper end of the expanding drum 66, as illustrated in FIG. 5B. As a result, the expanding drum 66 is elevated with respect to the frame support table 68, expanding the expandable tape 41 as it is raised upwardly by the expanding drum 66. When the expandable tape 41 is expanded, the substrate 33 is subject to external forces applied in the directions to expand the expandable tape 41. Under the external forces thus applied, the substrate 33 starts to be divided into the substrates 13 from the modified layers 39, thereby completing the BAW devices 11.

The present invention is not limited to the above embodiment, but various changes and modifications may be made therein. For example, although the modified layer forming step is carried out after the elastic wave diffusing region forming step in the illustrated embodiment, the elastic wave diffusing region forming step may be carried out after the modified layer forming step. In the dividing step according to the illustrated embodiment, the substrate 33 is divided by the expanding apparatus 62. However, the substrate 33 may be divided by a method wherein a pressing blade is pressed against the substrate 33 along the projected dicing lines 35, for example.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A bulk acoustic wave device comprising:
    a substrate; and
    a piezoelectric element formed on a surface of said substrate;
    wherein said substrate has a plurality of elastic wave diffusing regions disposed at predetermined intervals within the substrate for diffusing an elastic wave, said elastic wave diffusing regions being formed by modifying said substrate with a laser beam.

2. A method of manufacturing a bulk acoustic wave device, comprising:
    an elastic wave diffusing region forming step of irradiating a substrate with a piezoelectric element formed on a face side thereof with a laser beam having a wavelength that is transmittable to said substrate, from a reverse side of the substrate while the laser beam is being focused at a point within said substrate, thereby modifying the inside of the substrate at predetermined intervals to form a plurality of elastic wave diffusing regions within the substrate for diffusing an elastic wave.

* * * * *